US009627179B2

(12) United States Patent
Carson et al.

(10) Patent No.: US 9,627,179 B2
(45) Date of Patent: Apr. 18, 2017

(54) SUBSTRATE ALIGNMENT THROUGH DETECTION OF ROTATING TIMING PATTERN

(71) Applicant: Doug Carson & Associates, Inc., Cushing, OK (US)

(72) Inventors: Douglas M. Carson, Cushing, OK (US); Mike Chatterton, Stillwater, OK (US)

(73) Assignee: Doug Carson & Associates, Inc., Cushing, OK (US)

( * ) Notice: Subject to any disclaimer, the term of this patent is extended or adjusted under 35 U.S.C. 154(b) by 0 days.

(21) Appl. No.: 15/081,191

(22) Filed: Mar. 25, 2016

(65) Prior Publication Data

US 2016/0284508 A1 Sep. 29, 2016

Related U.S. Application Data

(60) Provisional application No. 62/138,776, filed on Mar. 26, 2015.

(51) Int. Cl.
*H01J 37/30* (2006.01)
*H01L 21/67* (2006.01)
(Continued)

(52) U.S. Cl.
CPC .... *H01J 37/3005* (2013.01); *B01L 3/502707* (2013.01); *H01J 37/20* (2013.01); *H01J 37/3174* (2013.01); *H01L 21/67259* (2013.01); *H01L 21/67282* (2013.01); *H01L 21/681* (2013.01); *H01L 23/544* (2013.01);
(Continued)

(58) Field of Classification Search
CPC ....... B01L 3/502707; B01L 2300/0806; B01L 2300/0887; H01J 37/3005; H01J 37/20; H01J 37/3174; H01J 2237/2007; H01J 2237/31728; H01L 21/67259;
(Continued)

(56) References Cited

U.S. PATENT DOCUMENTS 3,783,520 A 1/1974 King
4,423,127 A 12/1983 Fujimura
(Continued)

FOREIGN PATENT DOCUMENTS

WO 02/059372 A2 8/2002

*Primary Examiner* — David E Smith
(74) *Attorney, Agent, or Firm* — Hall Estill Attorneys at Law

(57) ABSTRACT

Apparatus and method for aligning a rotatable substrate. In some embodiments, a circumferentially extending timing pattern is formed on a substrate. The timing pattern nominally extends about a center point of the substrate at a selected radius. The substrate is mounted to a support mechanism which rotates the substrate about a central axis. Due to mechanical tolerances, the central axis will be offset from the center point of the substrate as a result of an alignment error during the mounting of the substrate. The offset between the support mechanism central axis and the center point of the substrate is determined using a detector that detects two opposing cross-over transitions of the timing pattern during each revolution of the substrate. A feature may be written to the substrate by positioning a write element with respect to the substrate responsive to the detected offset.

20 Claims, 7 Drawing Sheets

(51) Int. Cl.

| | |
|---|---|
| ***H01L 23/544*** | (2006.01) |
| ***H01J 37/317*** | (2006.01) |
| ***H01J 37/20*** | (2006.01) |
| ***B01L 3/00*** | (2006.01) |
| ***H01L 21/68*** | (2006.01) |

(52) U.S. Cl.
CPC .................. *B01L 2300/0806* (2013.01); *B01L 2300/0887* (2013.01); *H01J 2237/2007* (2013.01); *H01J 2237/3175* (2013.01); *H01L 2223/54426* (2013.01); *H01L 2223/54453* (2013.01)

(58) Field of Classification Search
CPC . H01L 21/67282; H01L 21/68; H01L 23/544; H01L 2223/54426
See application file for complete search history.

(56) References Cited

U.S. PATENT DOCUMENTS

| | | | | |
|---|---|---|---|---|
| 5,503,959 | A | 4/1996 | Langston | |
| 5,796,541 | A | 8/1998 | Stein et al. | |
| 5,905,850 | A | 5/1999 | Kaveh | |
| 5,930,577 | A | 7/1999 | Forsthoefel et al. | |
| 6,509,247 | B2 | 1/2003 | Chen et al. | |
| 6,622,991 | B2 | 9/2003 | Steffes | |
| 6,633,451 | B1 * | 10/2003 | Chainer | G11B 5/59633 360/75 |
| 6,785,075 | B2 | 8/2004 | Bryant et al. | |
| 6,856,029 | B1 | 2/2005 | Daniel et al. | |
| RE39,044 | E | 3/2006 | Ross | |
| 7,529,051 | B2 * | 5/2009 | Hanson | G11B 5/5526 360/51 |
| 8,174,634 | B2 | 5/2012 | Sirringhaus et al. | |
| 8,208,121 | B2 | 6/2012 | Bijnen et al. | |
| 8,319,510 | B2 * | 11/2012 | Ogino | G01R 31/2887 324/750.16 |
| 2002/0045105 | A1 | 4/2002 | Brown et al. | |
| 2006/0280078 | A1 * | 12/2006 | Hanks | G11B 7/0037 369/47.39 |
| 2008/0304173 | A1 | 12/2008 | Albrecht et al. | |
| 2010/0061004 | A1 | 3/2010 | Carson | |
| 2010/0128583 | A1 * | 5/2010 | Albrecht | G11B 5/5965 369/47.14 |
| 2013/0172985 | A1 | 7/2013 | Prestwich et al. | |
| 2013/0177129 | A1 * | 7/2013 | Suzuki | A61B 6/0457 378/4 |

* cited by examiner

SUBSTRATE ALIGNMENT THROUGH DETECTION OF ROTATING TIMING PATTERN

RELATED APPLICATION

The present application makes a claim of domestic priority under 35 U.S.C. 119(e) to U.S. Provisional Application No. 62/138,776 filed Mar. 26, 2015, the contents of which are hereby incorporated by reference.

BACKGROUND

Patterns are created on substrates for a variety of applications, such as during the manufacture of optical and magnetic data storage media and the formation of semiconductor integrated circuit (IC) devices. Depending upon the processing involved, a substrate may be subjected to multiple steps using different types of equipment.

These and other forms of processing may involve mounting the substrate in a recording system such as but not limited to an electron beam recorder (EBR). The substrate is rotated by a support mechanism (generally referred to herein as a "turntable") about a central axis and subjected to a recording beam that writes a recorded pattern to the substrate. The recorded pattern can take the form of any number of linear or circumferentially arranged features including data bits, semiconductor elements, bar codes, images, holograms, etc.

The formation of multi-layer features may require the substrate to be mounted in the recording system, or in other recording systems, multiple successive times to generate features in different layers of the substrate. The substrate may be removed between successive passes for other processing (e.g., metallization, cleaning, chemical or physical vapor deposition, etc.), requiring the substrate to be remounted each time a new recording pass is applied.

It can be seen that multi-layer processing requires adequate registration (alignment) of the substrate with a known reference point such that newly written features align with previously recorded features on the substrate. Alignment techniques of the existing art, however, are often inadequate to achieve the requisite registration of the substrate. This is because the relative angular position of the substrate and the turntable will tend to be different for each mounting of the substrate, and the exact centering of the substrate on the turntable will tend to be different for each mounting of the substrate.

SUMMARY

Accordingly, various embodiments of the present disclosure are generally directed to an apparatus and method for aligning a rotatable substrate, such as a data recording medium, a semiconductor wafer, a biomedical substrate, etc. subjected to multiple pass processing operations.

In some embodiments, a circumferentially extending timing pattern is formed on a substrate. The timing pattern nominally extends about a center point of the substrate at a selected radius. The substrate is mounted to a support mechanism which rotates the substrate about a central axis. Due to mechanical tolerances, the central axis will be offset from the center point of the substrate as a result of an alignment error during the mounting of the substrate. The offset between the support mechanism central axis and the center point of the substrate is determined using a detector that detects two opposing cross-over transitions of the timing pattern during each revolution of the substrate. A feature may be written to the substrate by positioning a write element with respect to the substrate responsive to the detected offset.

DETAILED DESCRIPTION

Various embodiments of the present disclosure are generally directed to an apparatus and method for aligning a substrate. As explained below, some embodiments generally involve forming a circumferentially extending timing pattern on a substrate, with the timing pattern nominally extending about a center point of the substrate at a selected radius. The substrate is mounted to a support mechanism and rotated about a central axis of the support mechanism. The central axis is offset from the center point of the substrate as a result of an alignment error during the mounting of the substrate.

The offset between the support mechanism central axis and the center point of the substrate is determined using a detector that detects two cross-over transitions of the timing pattern during each revolution of the substrate. The detector may be positioned a selected distance from the support mechanism central axis with the selected distance being nominally equal to the selected radius of the timing pattern.

In some embodiments, the offset is expressed in terms of translational offset in terms of the respective central axis and center point, and/or angular (rotational) offset of the substrate with respect to the support mechanism. The translational and/or angular offset values serve as compensation values used to adjust the location of a recording (write) beam that impinges the substrate to write features to the substrate.

Figure 1:
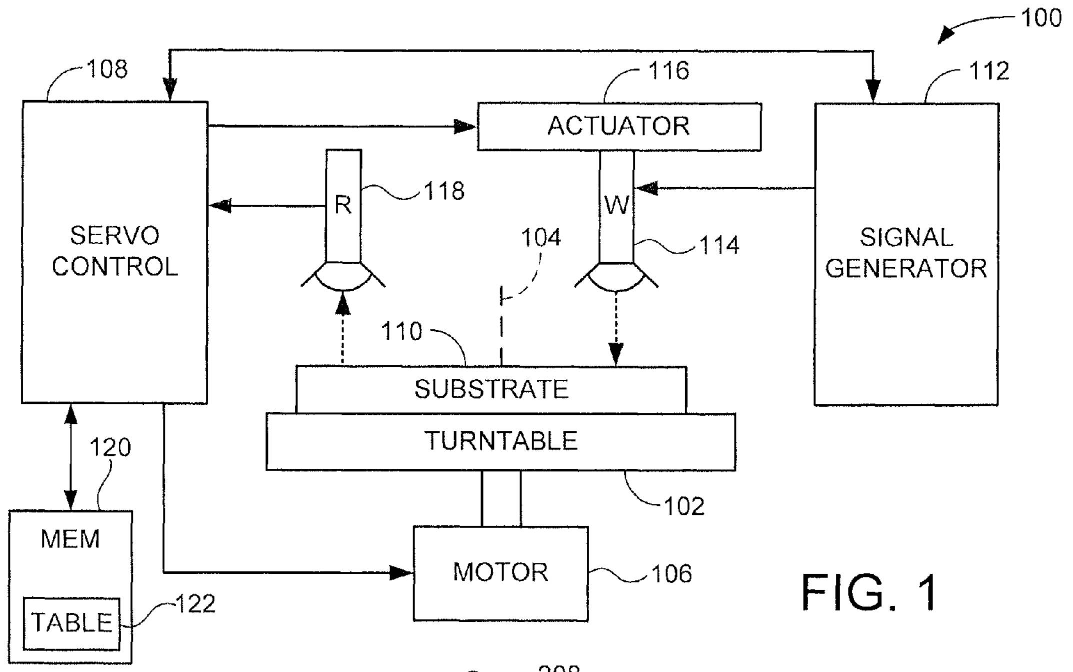
FIG. 1 is a functional block diagram for a recording system constructed and operated in accordance with some embodiments of the present disclosure.

These and other aspects and advantages of the present disclosure can be understood beginning with a review of FIG. 1, which provides a simplified functional block diagram of a recording system 100. The recording system 100 is characterized as an electron beam recorder (EBR), but such is merely for purposes of providing an illustrative example and is not limiting. Any number of processing systems can be used, including systems that do not use a recording beam as part of a substrate processing application.

The system 100 includes a support mechanism 102, referred to herein generally as a turntable. The turntable 102 is rotated about a central axis 104 by a motor 106 controlled by a servo control circuit 108. The turntable 102 is rotated about the axis 104 in accordance with a selected velocity profile, which may include constant angular velocity (CAV) rotation and/or constant linear velocity (CLV) rotation.

A substrate 110 is mounted to the turntable 102 for rotation thereby about the central axis 104. In some cases, the substrate 110 may be merely placed on the turntable 102 and adhesive forces (e.g., Van de Walls forces, etc.) may be sufficient to retain the substrate in a mounted relation to the turntable. In other cases, mechanical or other attachment mechanisms, such as a vacuum chuck, etc., may be employed to secure the substrate to the turntable. Regardless, it is contemplated that the substrate is rigidly secured to the turntable and will be rotated therewith during operation of the motor 106.

The substrate 110 can take any number of suitable forms depending on the application. In some cases, the substrate is disc-shaped although such is not necessarily required since the substrate can take substantially any form including rectilinear, irregular, etc. The substrate may be a single layer or multi-layer element.

In some embodiments, the substrate represents a master disc for an optical data recording disc from which a population of nominally identical replicated discs (replicas) are subsequently formed, so that the system 100 is used to expose a layer of the substrate to record features thereto that will ultimately be incorporated into the replicas. However, this is merely for purposes of illustration and is not limiting.

In other embodiments, the substrate may take the form of a semiconductor wafer on which one or more integrated circuits are formed, a magnetic recording disc, a biomedical device, any other form of element to which features are recorded by the recording system 100, or any other form of element to which any type of processing is applied, whether the substrate is rotated or not, provided that the substrate can be at least temporarily rotated (or contrawise, a detection mechanism can be rotated or otherwise translated relative to the substrate) in order to assess the relative location of the substrate, as explained below.

A signal generator circuit 112 is adapted to provide a recording signal to a write transducer (W) 114. In some cases, the recording signal may be a modulation signal such as an extended frequency modulation (EFM) signal with time varying transitions corresponding to boundaries of features to be written to the substrate. The write transducer 114 may take the form of an electron beam generator or similar. The recording signal modulates a write beam that impinges the substrate to form various recorded features thereon.

In some cases, the modulation signal may provide on-off modulation so that the write beam selectively exposes a selected layer of the substrate 110 (such as a resist or mask layer) when the write transducer 114 is "on." In other cases, power modulation may be supplied so that the recording signal adjusts an applied power of the write beam to different energy levels to write the various features to the substrate. In still other embodiments, deposition processing, such as chemical vapor deposition (CVD) or physical vapor deposition (PVD) techniques may be applied to the substrate. Substantially any form of write beam exposure can be used and indeed, as noted above, such is not necessarily required.

The embodiment of FIG. 1 further shows the recording system 100 to include an actuator 116 which advances the transducer 114 relative to the central axis 104. While not shown, it will be understood that the actuator may include deflection plates or other mechanisms so that the beam is deflected radially or angularly with respect to the central axis even if the transducer itself is not repositioned. The actuator 116 thus provides beam positional control and is under the direction of the servo control circuit 108.

FIG. 1 shows a detector 118, also referred to herein as a reader (R), which detects one or more alignment timing patterns formed on the substrate 110. As explained below, the detection of the timing patterns by the detector 118 serves to allow identification of any translational (e.g., eccentricity) and/or angular offsets of the substrate 110 with respect to the central axis 104. This allows suitable adjustments during a recording operation, such as adjustments in the placement of the write beam, as well as other compensation operations as desired.

A local memory 120 is accessible by the servo control circuit 108 (also referred to as a control circuit) and stores a data structure such as in the form of a look up table 122. As explained below, various parameters may be stored in the table 122 for use by the control circuit. For example, the timing patterns written to the substrate may include identification (ID) values or other multi-bit values that are detected by the detector and passed to the control circuit, which compares with entries in the table 122 to ensure a correct substrate is being processed.

Figure 2:
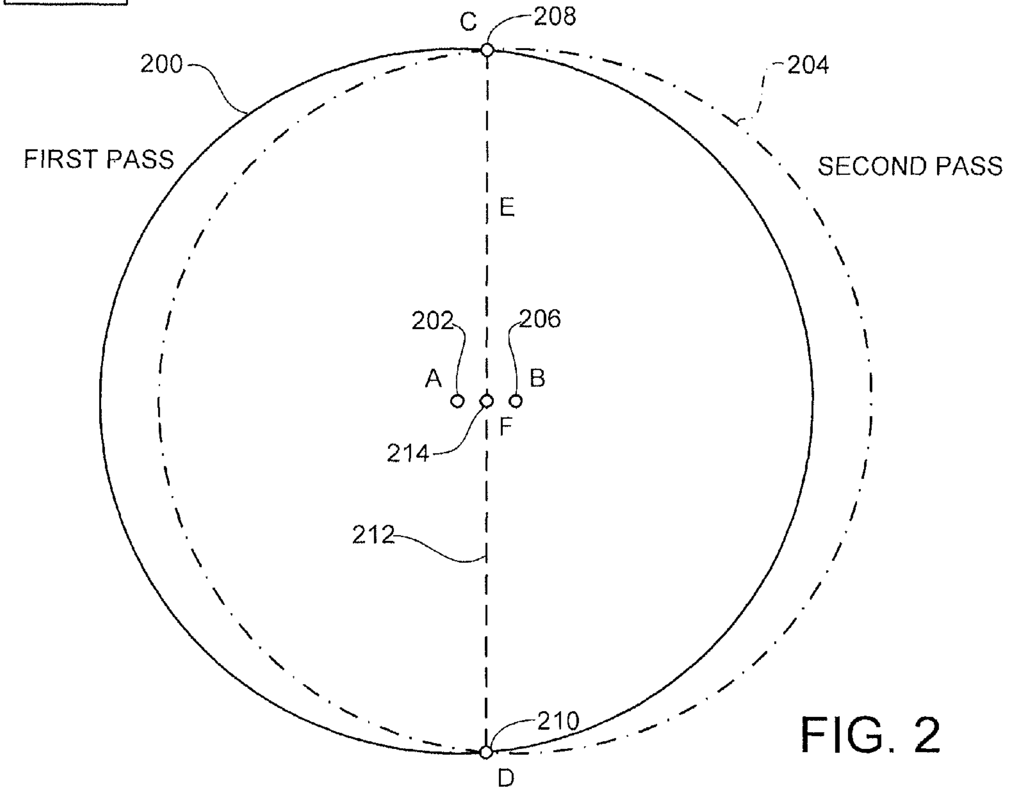
FIG. 2 is a schematic representation of an alignment timing pattern formed by the recording system of FIG. 1 in some embodiments.

FIG. 2 is a schematic representation of a circumferentially extending alignment timing pattern 200 written to the substrate 110 of FIG. 1 in accordance with some embodiments. The pattern 200 can take any number of suitable forms as discussed below, but at this point it will be appreciated that the timing pattern substantially inscribes a full or partial circular path about a center point 202 of the substrate, denoted as point A, at a fixed radius. It is contemplated although not necessarily required that the pattern 200 be written by a recording system such as 100 in FIG. 1 during a first mounting of the substrate 110 to the turntable 102. While not necessarily required, it is further contemplated in at least some embodiments that the detector 118 in FIG. 1 is positioned at nominally the same radius as the timing pattern 200; in other words, once written, the detector 118 can nominally detect the entirety of the timing pattern 200 as the substrate rotates under the detector.

It will be appreciated that the "center point A" 202 may or may not necessarily correspond to the exact center of the substrate 110. Instead, the center point A nominally corresponds to the center of the pattern 200 and thus represents a mathematical point on the substrate that may, or may not, be separately identified by a feature or other mark on the substrate. In one embodiment, the substrate 110 is mounted to the turntable 102 in FIG. 1 a first time with as much precision as is achievable so that the exact center of the substrate is nominally aligned with the exact center of the turntable (some amount of offset, however, will tend be present, even if miniscule, due to mechanical tolerances).

Once mounted, the substrate 110 is rotated by the turntable 102 and the substrate will, based on the construction of the system 100, necessarily rotate about the central axis 104. By maintaining the write beam at a fixed radial distance from the central axis 104 (which may correspond to the radial distance of the detector 118 from the central axis 104), the write transducer 114 can be used to inscribe the timing pattern 200 so as to be nominally centered about point A, as represented in FIG. 2. Stated another way, the center point A 202 represents the location at which the central axis 104 penetrated the substrate when the timing pattern 200 was first written.

Broken line path 204 represents the subsequent location of the timing pattern 200 after the substrate 110 has been removed from the turntable 102, processed using some sort of suitable processing (e.g., metallization, cleaning, chemical or physical vapor deposition, etc.) on other equipment, and returned for re-mounting on the turntable 102. The geometric center of the timing pattern 204 is represented at 206 by point B.

The translational distance between points A and B represent the positional error in the substrate between the first time the substrate 110 was mounted to the turntable 102 and the second time the substrate was mounted to the turntable. The actual amount of translational error has been exaggerated in FIG. 2 for clarity of illustration, but it will be appreciated by the skilled artisan that, in most cases, some amount of translational error may arise as a result of mechanical tolerances and other positional errors. Even if a highly accurate robotic arm or other end effector arrangement with closed loop positional control is used to remove and remount the substrate onto the turntable (or onto another turntable), some amount of translational error, such as depicted by the distance A-B, will tend to be present.

Once the substrate 110 is remounted to the turntable 102 in FIG. 1 so as to be offset from its original position by the distance A-B, the pattern 204 will exhibit repeated runout (RRO) eccentricity at a frequency corresponding to the rotational rate (e.g., revolutions per minute, rpm) of the turntable 102. Points C and D, numerically identified at 208 and 210, represent the cross-over points at which the detector 118 (FIG. 1) will detect the offset timing pattern 204.

Figure 3:
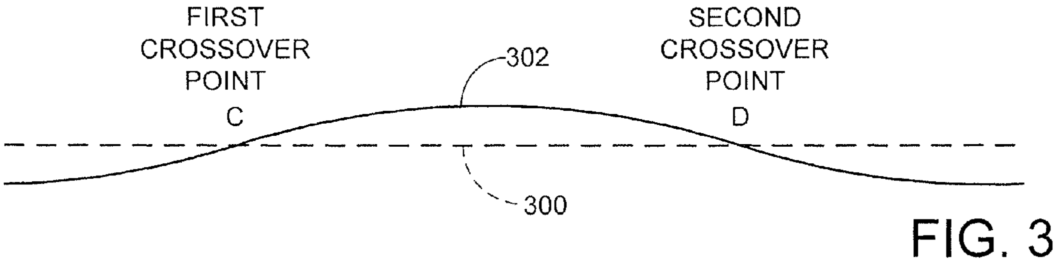
FIG. 3 depicts a detection path sensed by a detector of the recording system of FIG. 1 as it tracks a timing pattern such as represented in FIG. 2.

Referring to FIG. 3, dotted line 300 represents the path along which the detector 118 "travels" as it detects the adjacent rotating substrate. It will be appreciated that the detector 118 is fixed relative to the central axis 104; hence, it stays in place as the substrate "wobbles" below it. As noted above, the detector may move relative to the substrate to provide the same response. Solid line 302 represents the path taken by the eccentric timing pattern 204 inscribed to the substrate and offset as described above. Point C in FIGS. 2 and 3 represents the point at which the timing pattern moves across the "field of view" of the detector 118 as it crosses over from one radial position to the next. Point D in FIGS. 2 and 3 represents the point at which the offset timing pattern again moves across the field of view of the detector as it crosses over in the opposite direction.

Depending on the detection resolution of the detector 118 and the width of the timing pattern 204, it is contemplated that at these respective points the detector will "observe" the pattern moving across the "field of view" of the detector in a first direction at point C, and moving in the opposite direction at point D. Both the angular and radial locations of these points can be easily determined with reference to the angular position of the turntable (as provided by the servo circuit 108) and the radial position of the detector. The full eccentricity of the pattern may be within the field of view of the detector, so that the cross-over points can be understood as the midpoints of such relative movement and easily ascertained.

Referring again to FIG. 2, it can be seen that once points C and D have been identified, a segment E (line 212) can be mathematically constructed that adjoins these two points, and a midpoint F (point 214) can be identified as the midpoint of segment E. The midpoint F is exactly halfway between points A and B. Hence, by detecting cross-over points C and D, the exact amount of translational offset between points A and B can be calculated. The distance A-B is 2 times the distance from F-B. Point B is known because it corresponds to the central axis 104 about which the substrate 110 and turntable 102 are currently rotating. Point F is derived as the midway point between points C and D.

Once the amount of offset between points A and B is known, suitable compensation values can be applied. In some embodiments, the eccentricity of the substrate based on the translation from point A to point B can be fed forward as an RRO compensation signal to the actuator 116. In this way, a subsequently recorded feature (or portion thereof) can be aligned with a previously written feature that was written to the substrate 110 while the substrate was rotated about point A (202).

Figure 4A:
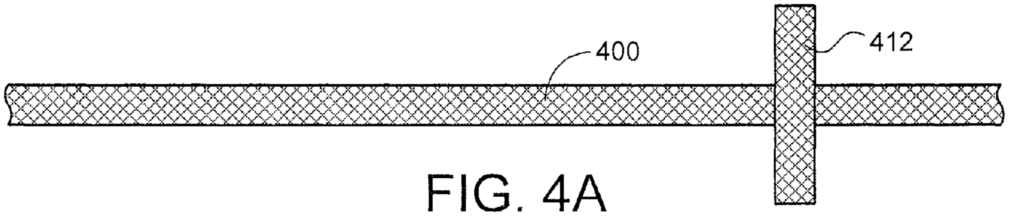
FIGS. 4A-4D provide exemplary forms of timing patterns that can be formed by the recording system.
Figure 4B:

The actual form of the timing pattern can vary depending on the requirements of a given application. In some embodiments, the timing pattern may take the form of a circumferentially extending pattern 400 of nominally uniform width, as represented in FIG. 4A. The pattern may instead be a sequence of discrete features, such as pits 402 separated by lands 404 as depicted in FIG. 4B. The pits and lands can be constant length or can vary around the circumference of the substrate as required to provide angular information with regard to the locations of the cross-over points.

Figure 4C:
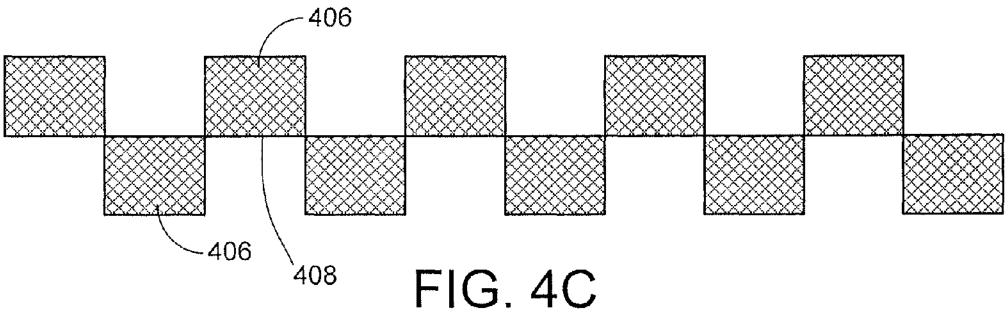
Figure 4D:
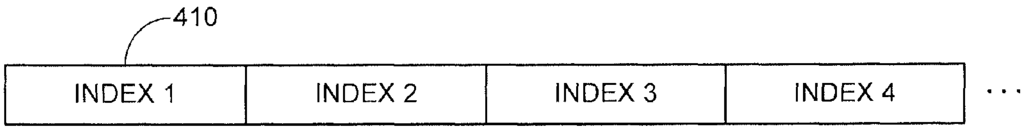

In other embodiments, the timing pattern may take the form of an offset pattern 406 as in FIG. 4C. The pattern 406 involves offset patterns that denote a centerline 408 that can be detected to determine the radial location of the pattern. In still further embodiments, the timing pattern may take the form of index fields 410, such as index fields 1-4 shown in FIG. 4D. In this case, each index field has a selected circumferential length and a unique identifier (including a sequentially incrementing identifier) so that the exact angular position of the cross-over points can be accurately determined based on the numerical values of the detected unique identifier values. In some cases, a unique identifier can be used to provide a once-around index point followed by a continuous pattern.

A variety of different forms and locations of the timing patterns are envisioned and can be used consonant with the foregoing discussion. In some cases, a moveable reader is used that tracks the eccentric timing pattern and, based on correction signals applied to maintain the reader over the timing pattern, the eccentricity of the substrate is calculated and compensated. In other cases, multiple readers are used such that one reader may track the timing pattern to detect angular position and a fixed reader may track cross-over points to detect translational position. These and other alternative arrangements will readily occur to the skilled artisan in view of the present disclosure.

With reference again to FIG. 4A, in some embodiments the circumferentially extending timing pattern can be configured to include a once-around timing mark 412. The timing mark 412 is depicted as a radially extending mark that intersects the timing pattern 400 at a selected angular location on the substrate. The timing mark 412 enables detection of a once around angular position of the substrate, enabling the system to determine not only radial offset but angular offset as well.

In some embodiments, the radial extent of the timing mark 412 can be sized to accommodate the largest amount of radial offset that may be experienced by the remounting of the substrate. For example, if the maximum offset is expected to be about 10 nanometers, nm, then the timing mark 412 may be sized to extend at least ±5 nm from the timing pattern 400. In this way, the fixed reader 118 (FIG. 1) will be able to not only identify the two cross-over points but also detect the angular reference point, thereby enabling the writing of data to the remounted substrate at the correct angular locations. Other forms of angular timing marks can be used apart from that shown in FIG. 4A. The arrangement of FIG. 4A can thus be viewed as a circumferentially extending timing pattern that extends over a first radial distance and has a radially extending index mark that extends over a second, greater radial distance.

In still further embodiments, a fixed position optical pickup need not necessarily be used. With reference again to FIG. 1, the reader (R) 118 can be mounted to the actuator 116, or another actuator, and swept radially in a selected radial direction, such as from a position adjacent the outermost diameter (OD) of the substrate 110 towards the innermost diameter (ID) of the substrate until the timing pattern 204 (FIG. 2) is detected. By sensing the two cross-over points and the timing mark (e.g., 412), both the translational and angular offset of the substrate can be determined and correction signals supplied to adjust the placement of the overlaid data accordingly.

Figure 5:
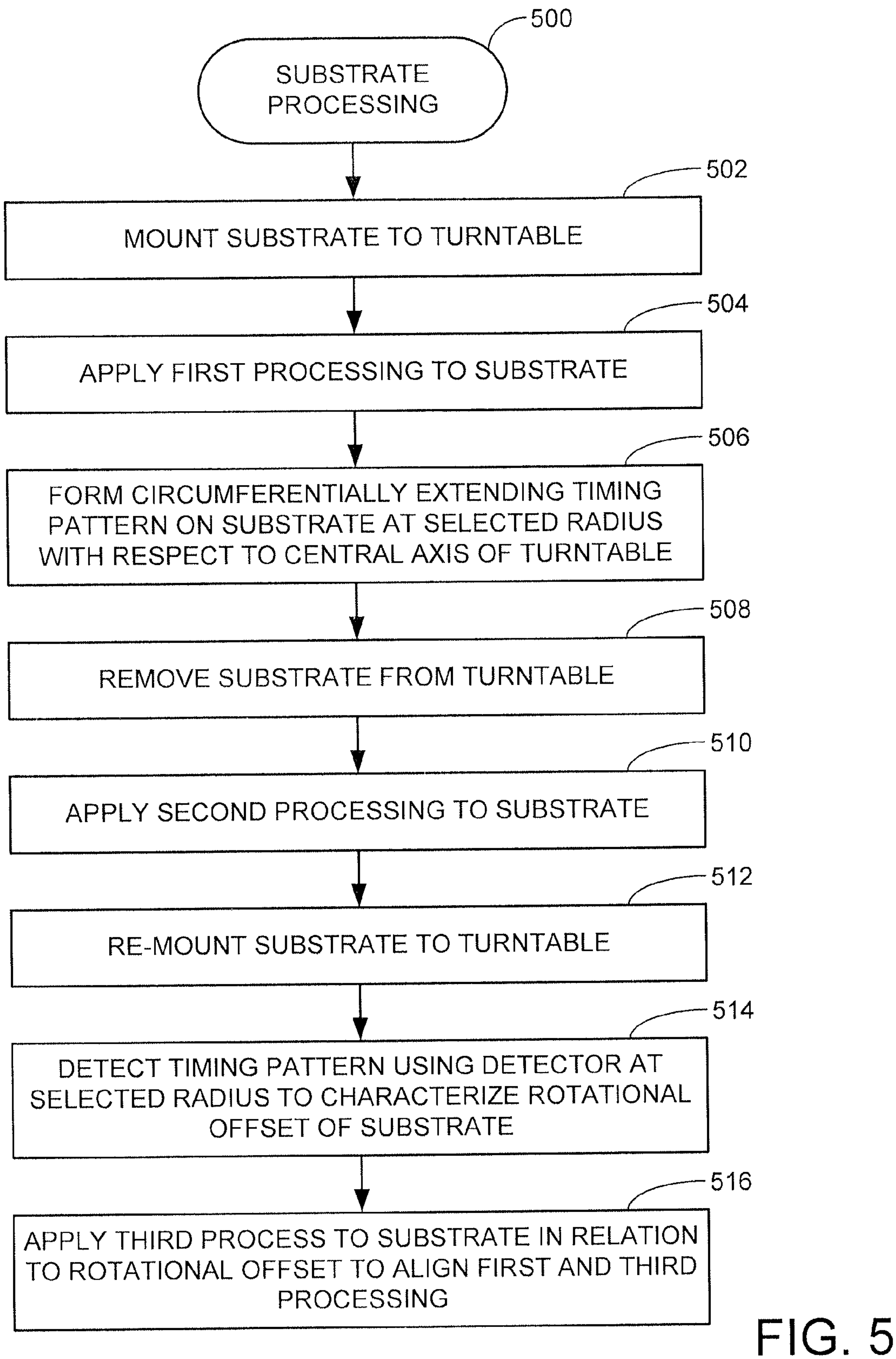
FIG. 5 is a substrate processing routine illustrative of steps that can be carried out in accordance with some embodiments.

FIG. 5 provides a flow chart for a substrate processing routine 500 to set forth steps that may be carried out in accordance with various embodiments. At step 502, a substrate such as the substrate 100 discussed above is mounted to a turntable such as the turntable 102 in FIG. 1. A first processing operation is applied to the substrate at step 504, such as but not limited to the use of a write beam such as from recording transducer 114 to the substrate to form a first series of features to the substrate.

A circumferentially extending timing pattern is formed on the substrate at step 506. This timing pattern may correspond to the pattern 200 in FIG. 2 and is nominally centered with respect to a central axis of the turntable from step 502.

At step 508, the substrate is removed from the turntable and a second level of processing is applied to the substrate at step 510. This processing can take any variety of forms, including but not limited to washing, etching, exposure, metallization, deposition, etc. The substrate is re-mounted to the turntable at step 512, which as discussed above may include translational and/or angular offsets with respect to the previous position of the substrate on the turntable.

The timing pattern is thereafter detected at step 514 during rotation of the substrate (via the turntable) to characterize the rotational offset of the substrate. As desired, the detected rotational offset is used as a compensation value during the application of a third level of processing to the substrate at step 516. This third level of processing can include the writing of a second series of features to the substrate, including features that overlay or otherwise combine with the first series of features to form combined features. While only two mountings of the substrate are represented in FIG. 5, it will be appreciated that multiple subsequent mountings can be made, and the same timing pattern can be used for each mounting. Alternatively, a separate timing pattern can be inscribed by each recording operation and multiple previously applied timing patterns can be detected and used to compensate a subsequent recording operation.

Figure 6:
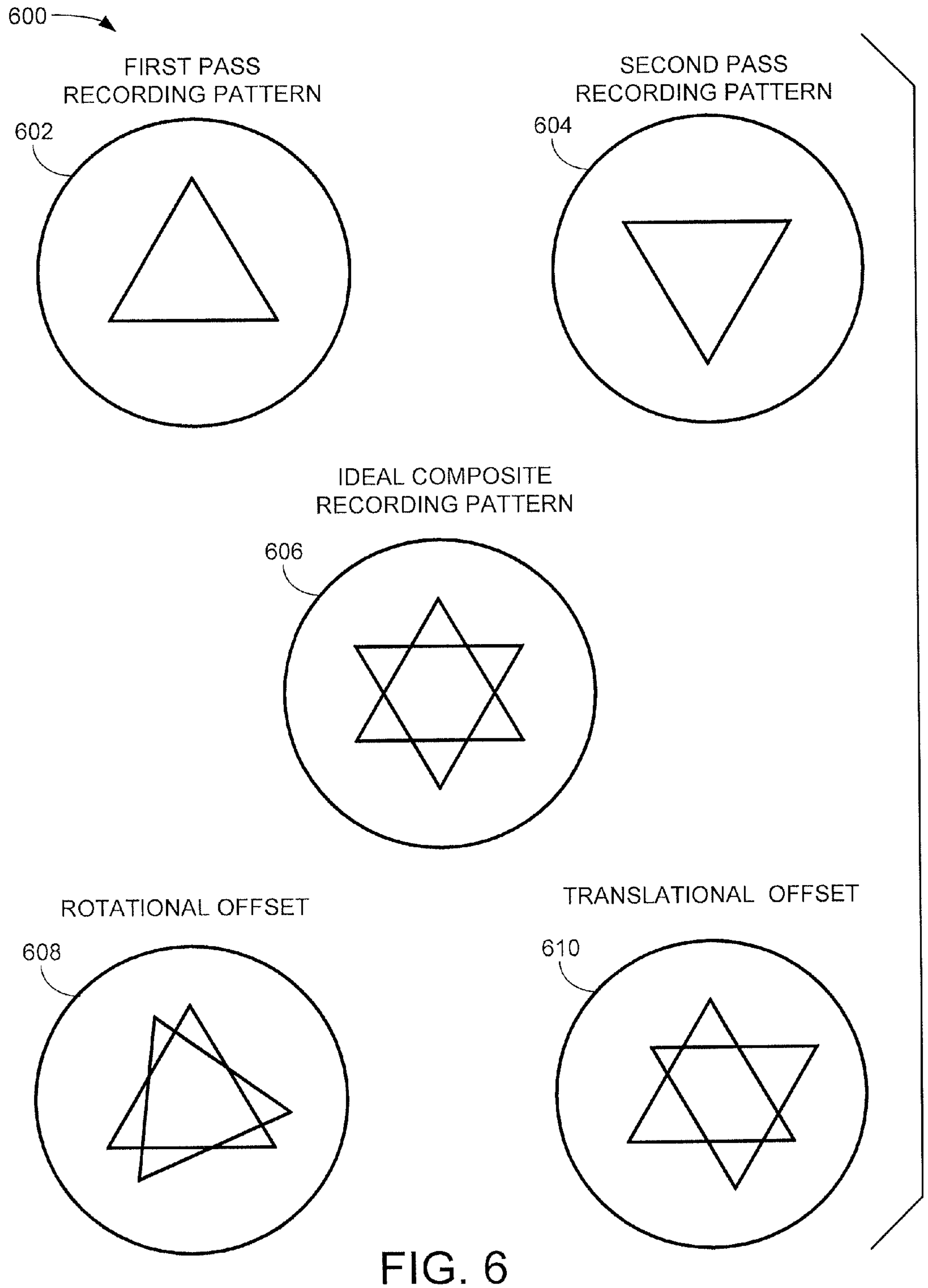
FIG. 6 illustrates various patterns (features) that may be formed using the routine of FIG. 5 in accordance with some embodiments.

FIG. 6 shows a sequence of patterns (features) 600 that may be overlaid onto a substrate using the routine of FIG. 5. A pattern 602 represents a first pass recording pattern and a pattern 604 represents a second pass recording pattern. Each of the patterns 602, 604 are depicted as triangles to provide a concrete example, but any suitable types of features can be used. An ideal composite recording pattern is depicted at 606, indicating proper alignment of the second pattern 604 onto the first pattern 602. In this sense, the patterns 602, 604 may be characterized as sub-features.

In practice, some misalignment of the respective patterns may arise as a result of misalignment of the substrate during the second installation as compared to the first in accordance with conventional alignment techniques. Combined pattern 608 shows the effects of rotational offset, and combined pattern 610 shows the effects of translational offset. It is contemplated that the use of the routine of FIG. 5 results in a nominal alignment such that the ideal combined recording pattern of 606 can be achieved irrespective of the physical differences in alignment of the substrate during the respective first and second passes.

Figure 7:
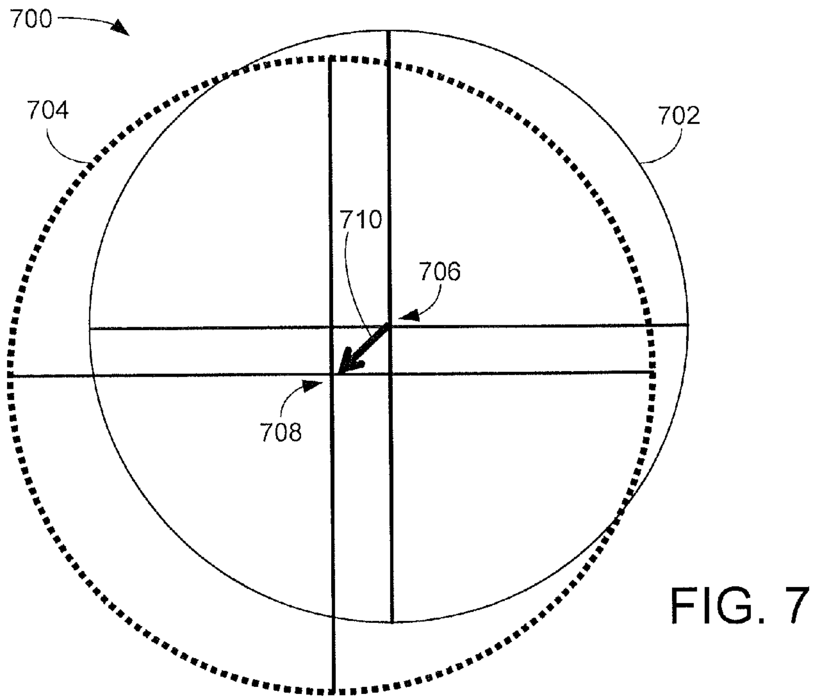
FIG. 7 illustrates another substrate aligned in accordance with the routine.

FIG. 7 shows a substrate 700 aligned during multiple processes. Solid circle 702 represents a particular alignment of the substrate 700 during a first pass, and dotted circle 704 represents a subsequent alignment of the substrate 700 during a second pass. The amount of misalignment is exaggerated. Processing is applied to the substrate during each of the first and second passes, and intermediate processing may be applied to the substrate using other equipment between the first and second passes. Origin point 706 represents a center of rotation during the first pass, and origin point 708 represents a center of rotation during the second pass. Arrow 710 represents the translational and rotational difference between the respective origin points 706, 708.

Figure 8A:
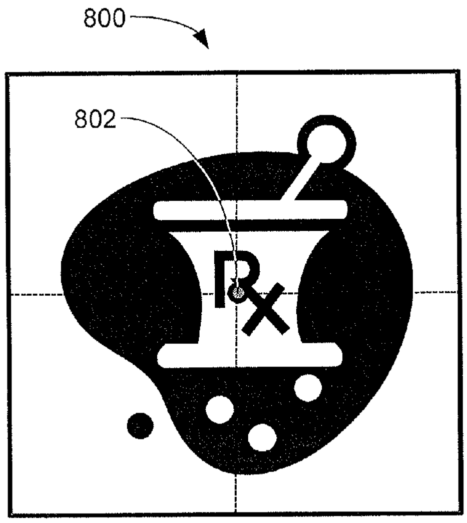
FIGS. 8A and 8B illustrate composite patterns (features) that may be written to the substrate of FIG. 7.
Figure 8B:
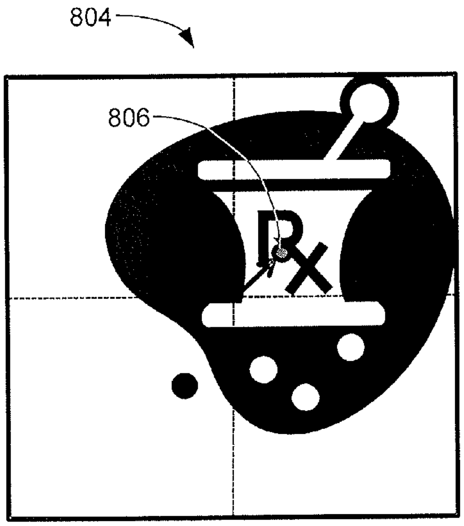

FIG. 8A shows a pattern (feature) 800 centered about an intended origin point 802 on a substrate. The pattern 800 is written using multiple passes as discussed above. Using the compensation techniques set forth above, the image is translated to provide translated pattern 804 centered about origin point 806, as shown in FIG. 8B.

Figure 9:
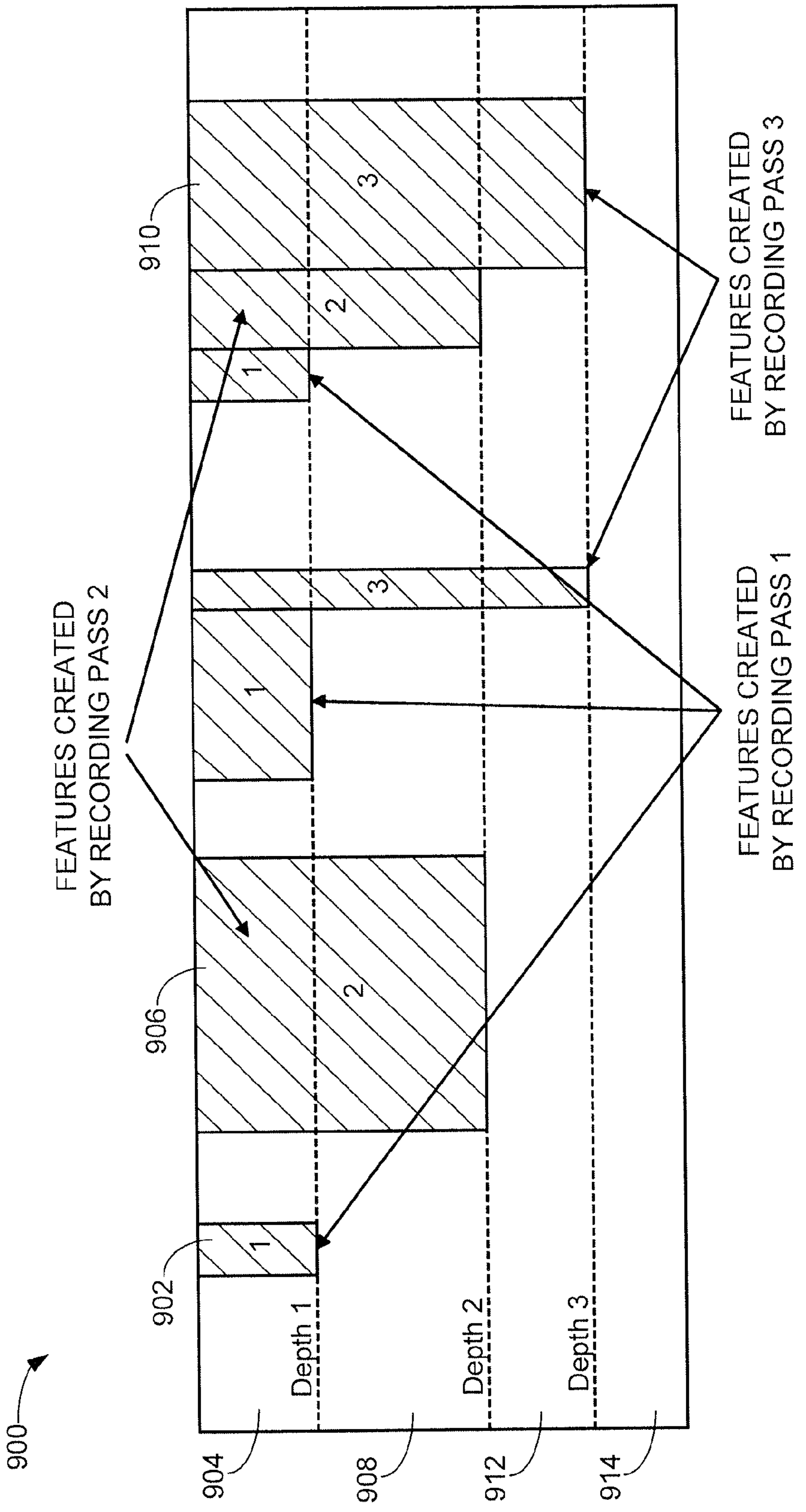
FIG. 9 illustrates another substrate formed in accordance with some embodiments.

FIG. 9 illustrates the application of three passes to form features 900 on a substrate having different dimensions, including different depths. The features can take any number of suitable forms including metallization areas, magnetic recording features, optically detectable features, etc. Features 902 have a first relative depth (Depth 1) and extend through a first layer 904. Features 906 have a greater, second relative depth (Depth 2) and extend through the first layer 904 and a second layer 908. Features 910 have a greater, third relative depth (Depth 3) and extend through the first and second layers 904, 908 as well as a third layer 912. A fourth layer 914 underlies and supports the upper layers 904, 908 and 912.

The respective features 902, 906 and 910 may be written during successively applied first, second and third passes. The substrate may be removed and remounted to an underlying turntable or other support mechanism (see FIG. 1) for each pass, and aligned as discussed above. Timing information in the form of one or more circumferentially extending timing patterns may be written during each pass, and prior written timing information can be used for subsequent alignment compensation.

In one embodiment, the substrate 900 is characterized as a recording substrate that is recorded and etched using three passes. For the first pass, the respective layers 904, 908 and 912 are deposited as a layer of recording resist and a write beam selectively exposes the resist in the locations of features 902.

After exposure, the substrate is removed and the resist is developed and used as an etching mask to etch down to the preselected Depth 1. The resist development can be either positive or negative, so that the resist that is removed to become the etching mask can either be those portions that were exposed during recording, or those portions that were not exposed during recording. It is contemplated that timing information such as pattern ID, sequence number, etc. are written, developed and etched into the recording substrate 900 for subsequent recovery by the recording apparatus.

After etching, a new layer of resist is placed on the surface of the recording substrate 900, and the substrate is remounted on the recording turntable. The recording system then records the data associated with the second pass. Optionally, the substrate or pattern ID and sequence number will be read prior to the beginning of recording to ensure the proper pattern is being recorded according to the design. Alignment compensation is also carried out as discussed above to ensure proper location of the second write operation. After exposure, the resist is developed and used as an etching mask to etch into the recording substrate down to the preselected Depth 2. The same process is repeated for the third pass, resulting in the finally formed features as shown in FIG. 9.

Any suitable coordinate system can be used to write the features to a given substrate, including angular coordinates, polar coordinates, XY coordinates, etc. It will be noted that detection of the use of the system as embodied herein can be readily determined by a skilled artisan through examination of a finished substrate, based on the characteristics of the features written thereto, as well as the relative alignment of the features with respect to the timing pattern.

In some embodiments, the substrate is configured as a biosciences substrate to facilitate various biomedical operations as a "lab on disc" or "lab on chip" type device. The finished substrate may be subjected to a partitioning (e.g., cutting) operation to cut the processed substrate into individual elements (e.g., pipettes, microfluidic channel networks, etc.), or the finished device may be retained as a rotatable disc (e.g., centrifuge devices, etc.).

These and other devices can be characterized as three-dimensional (3D) structures with internal passageways and other features to carry out various laboratory and other biomedical operations. Those skilled in the art will appreciate that such devices can be printed using XY CAD files and stepper lithography techniques where each "line" of features is printed at a time in a raster fashion. Because of the settle time required to dampen mechanical vibration at the end of each advancement of the write beam carriage, the printing of even a rudimentary pattern can take an extended period of time, such as on the order of hours or even days.

By contrast, the various embodiments disclosed herein can readily accept any number of inputs, including conventional XY CAD files, and print each layer during rotation of the underlying substrate. Coordinate conversion techniques to facilitate such writing (either as a continuous spiral or discrete rings) can be easily carried out using existing so-called "pit-art" writing methods in which XY designs are transferred to a rotating substrate over multiple passes and radial advancements of the write beam.

As before, the use of timing patterns can allow precise realignment of the write beam with respect to the new position of the substrate each time the substrate is remounted to a turntable or other support mechanism.

Figure 10A:
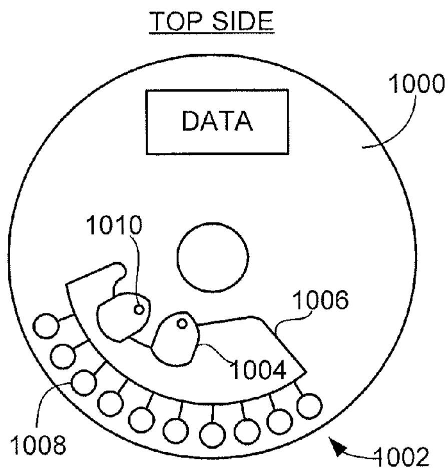
FIGS. 10A and 10B show another exemplary substrate characterized as a biomedical substrate in accordance with further embodiments.
Figure 10B:
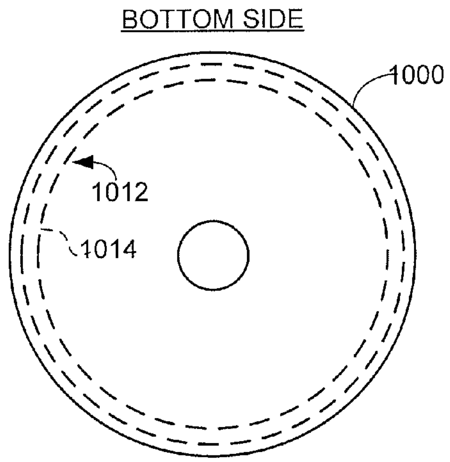

FIGS. 10A and 10B illustrate a simplified diagram of a biomedical substrate 1000 in accordance with some embodiments. It will be appreciated that the substrate 1000 is merely exemplary and can take any number of suitable forms.

As depicted in FIG. 10A, a top side of the substrate 1000 (also referred to herein as a "disc") is adapted to facilitate a microbiological assay through the use of a microfluidic network embedded therein. An exemplary network 1002 includes various features such as reservoirs 1004, microchannels 1006 and microchambers 1008. Apertures 1010 facilitate the introduction of test fluids and the venting of trapped atmospheric and reaction gasses. It will be appreciated that a wide variety of microfluidic networks can be utilized, including networks that incorporate additional features such as microswitches, laser or magnetic activated microactuators, fluorescing detection marks, etc.

As depicted in FIG. 10B, the bottom side of the substrate 1000 may be optionally configured to incorporate at least one data zone 1012. The data zone 1012 may include one or more data tracks 1014. The tracks may be arranged as discrete concentric rings or as a continuous spiral. The data zone 1012 is adapted to store control information associated with the network 1002 in FIG. 10A.

In some embodiments, the data zone 1012 is formatted in accordance with an existing optical disc standard (e.g., CD-ROM, DVD, BD, etc.) so that the data stored therein are recoverable using existing reader technology. The data zone may be pre-recorded or recordable. While the data zone is shown to be located adjacent the outermost diameter (OD) of the disc 1000, the data zone may be located elsewhere, such as adjacent the innermost diameter (ID) or in a medial location of the disc surface. Placement of the data zone on the side opposite the network is contemplated, but not necessarily required. Other forms of indicia can be supplied for the data zone such as machine readable bar codes, human readable alphanumeric characters, etc.

Multiple data zones may be used. For example, if the top surface of the disc has sufficient room to accommodate a plurality of different networks to carry out different respective assays, an associated number of different data zones may be provisioned on the bottom surface for each of these networks. Alternatively, a single, combined data zone could be used to store data for these different multiple networks.

Figure 11:
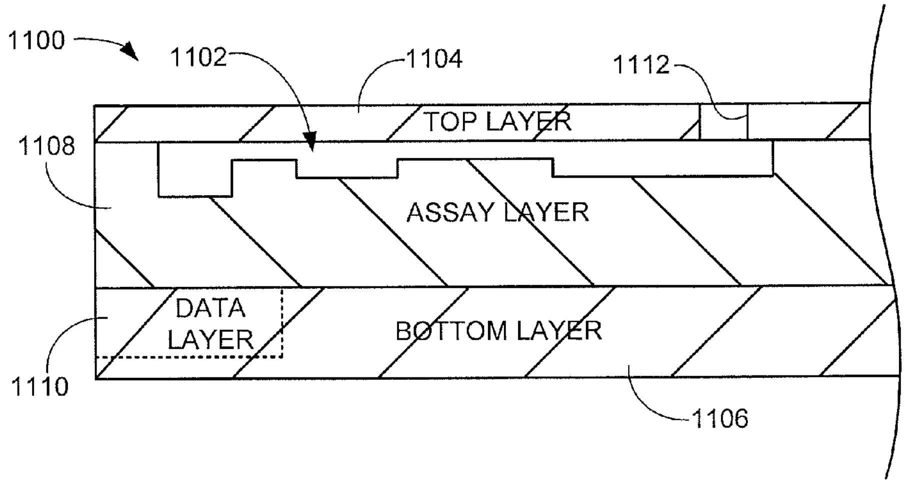
FIG. 11 is a cross-sectional elevational representation of a substrate having a three-dimensional (3D) structure formed thereon in accordance with the routine of FIG. 5 in some embodiments.

FIG. 11 provides a schematic depiction of various layers of a biomedical or other 3D structured disc 1100, which may be similar to the disc 1000 in FIGS. 10A-10B. The structure in FIG. 11 is merely exemplary and other arrangements of layers may be used. The final assembled disc 1100 may be a laminate of various layers that are separately formed and combined together during manufacture. A microfluidic network 1102 is formed from exemplary layers including opposing top and bottom layers 1104 and 1106, an assay layer 1108, and a data storage layer 1110.

The microfluidic network 1102 extends into the assay layer 1104 as a sequence of different recesses that extend different depths into the assay layer. The top layer 1104 may form a top surface for these various features. A fill/vent aperture 1112 can be arranged to extend through the thickness of the top layer 1104 as shown.

The data storage layer 1110 may be formed in the bottom layer 1106. In some embodiments, the top layer 1104, bottom layer 1106 and assay layer 1108 may be formed as separate substrates which are then bonded together to form a unitary substrate. In other embodiments, appropriate processing, such as injection molding, is applied to form a single substrate with features on opposing sides.

Figure 12:
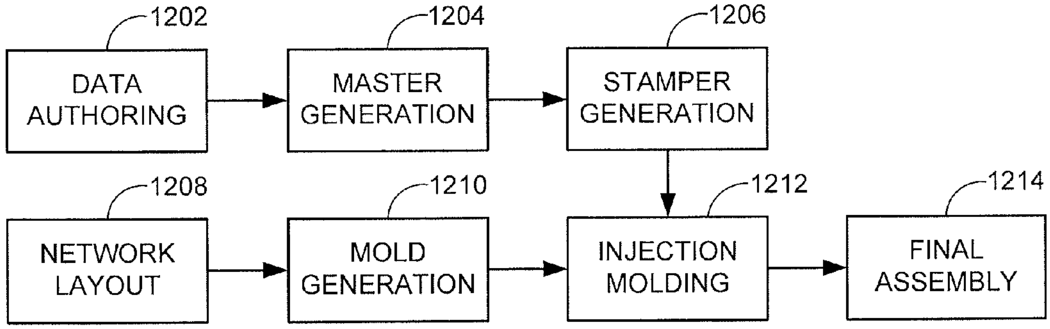
FIG. 12 is a functional flow diagram showing processing that may be applied to a substrate such as the exemplary substrates of FIGS. 10A, 10B and 11 in accordance with further embodiments.

FIG. 12 shows a processing sequence to form 3D substrates such as generally depicted in FIGS. 10A-10B and 11. FIG. 12 is merely exemplary as other processing steps may be used as required. A dual path is envisioned whereby separate processing is used to respectively format the data zone and the microfluidic network. It will be appreciated that timing patterns are written and utilized for alignment of the respective substrates over multiple processing operations as discussed herein.

Step 1202 represents a data authoring operation in which the control information to be stored to the disc is created and encoded in a form suitable for recording. A master generation step 1204 involves using a laser beam recorder (LBR), electron beam recorder (EBR) or similar equipment to form a master disc with the encoded control information.

A stamper generation step 1206 prepares a corresponding series of stampers suitable for disc replication. It will be noted that the foregoing steps can be carried out regardless whether the data zone is pre-recorded (embossed pits/lands) or recordable (data recordable layer); if the latter, the stamper may have wiggle pre-groove information to pre-define the locations for the data to be subsequently written to the disc. Stampers may be formed using suitable metallization processing to form various recessed features.

The steps involved in forming the network portion of the discs includes a network layout step 1208, and a mold generation step 1210. The mold generation provides the necessary molding features to form the various recesses that make up the network.

Once the molds/stampers are available, both are combined for use in an injection molding process at 1212 whereby a suitable molten material (e.g., plastic) is injected into the mold and cooled to provide single substrates with network features on one side and data features on the opposing side. Final assembly post processing may include the attachment of cover layers, the writing of the control information (if necessary), packaging, etc. as denoted at 1214. Such final assembly may include the partitioning (e.g., cutting) of the substrate into individual elements for use.

It will now be appreciated that the various embodiments presented herein can be adapted for a wide variety of different applications, including but not limited to optical discs, magnetic recording discs, semiconductors, biomedical devices, other forms of 3D structures, etc. Similarly, while the alignment processing has been applied in the context of processing that employs application of a write beam to the substrate, it will be appreciated that this is also merely exemplary and is not necessarily limiting in that any number of different forms of processing can be applied to the substrates as desired once the translational and/or angular offsets of the substrate are identified.

What is claimed is:

1. A method comprising:

forming a circumferentially extending timing pattern on a substrate, the timing pattern nominally extending about a center point of the substrate at a selected radius;

mounting the substrate to a support mechanism for a first pass;

rotating the substrate about a central axis of the support mechanism, the central axis offset from the center point of the substrate by a first offset value as a result of an alignment error arising from the mounting of the substrate during the first pass;

determining the first offset value between the support mechanism central axis and the center point of the substrate using a detector that detects two opposing cross-over transitions of the timing pattern during each revolution of the substrate, the detector positioned a selected distance from the support mechanism central axis with the selected distance substantially equal to the selected radius of the timing pattern;

writing a first feature to the substrate during said rotation using a write beam that is adjusted using the determined first offset value;

removing the substrate from the support mechanism;

applying a transformational process to the substrate;

remounting the substrate to the support mechanism for a second pass;

rotating the substrate about a central axis of the support mechanism, the central axis offset from the center point of the substrate by a second offset value as a result of an alignment error during the mounting of the substrate during the second pass;

determining the second offset value between the support mechanism central axis and the center point of the substrate using the detector to detect two opposing cross-over transitions of the timing pattern during each revolution of the substrate; and writing a second feature adjacent the first feature using the write beam while adjusting the write beam using the second offset value.

2. The method of claim 1, wherein the substrate is characterized as a biomedical disc having a three dimensional structure.

3. The method of claim 1, wherein the forming step comprises mounting the substrate to the support mechanism, rotating the substrate and writing the timing pattern during said rotation, wherein the center point of the substrate about which the timing pattern circumferentially extends aligns with the central axis of the support mechanism.

4. The method of claim 1, wherein each of the first offset value and the second offset value is respectively characterized as a translational offset distance between the central axis of the support mechanism and the center point of the substrate.

5. The method of claim 1, wherein each of the first offset value and the second offset value is respectively characterized as an angular offset comprising a rotational offset with respect to a once-around index point on the substrate.

6. The method of claim 1, further comprising storing the respective first and second offset values in a memory in the form of one or more compensation values, and using the one or more compensation values to adjust a position of the write beam to write the respective first and second features.

7. The method of claim 1, further comprising radially advancing the detector with respect to the rotating substrate to detect the cross-over transitions of the timing pattern.

8. The method of claim 1, wherein the detector detects an angular timing mark to identify an angular offset of the substrate with respect to the turntable.

9. The method of claim 1, wherein the two opposing cross-over transitions are nominally detected on opposing sides of the central axis.

10. The method of claim 1, wherein the second feature overlaps the first feature to provide a combined recording feature.

11. A recording system for recording data to a rotatable substrate, the recording system comprising:

a support mechanism configured to rotate the substrate about a central axis;

a write element configured to write features to the substrate during said rotation;

a detector adjacent an outermost perimeter of the substrate configured to detect a circumferentially extending timing pattern on the substrate which extends at a fixed radius from a center point of the substrate, the timing pattern comprising a continuously extending, circular optically detectable pattern that extends about the center point and a once-per-rev optically detectable index mark; and a control circuit configured to determine an offset value indicative of a displacement distance between the central axis of the support mechanism and the center point of the substrate responsive to two opposing cross-over transitions of the timing pattern detected by the detector over a full revolution, the control circuit further configured to adjust a position of the write element to write a feature to the rotating substrate responsive to the offset value.

12. The recording system of claim 11, wherein the write element is further configured to write the circumferentially extending timing pattern to the substrate during a previous rotation thereof during which the central axis is aligned with the center point.

13. The recording system of claim 11, further comprising an actuator configured to radially advance the detector to a radial position at which the detector is held in a fixed relation relative to the substrate and at which point the two opposing cross-over transitions from the timing pattern are detected.

14. The recording system of claim 11, wherein the timing pattern further comprises a multi-bit identification (ID) value associated with the substrate, the detector is further configured to detect the ID value, and the control circuit is further configured to compare the detected ID value with an entry in a data structure in a memory to verify a correct substrate is mounted to the support mechanism prior to the writing of the feature thereto.

15. A substrate having the circumferentially extending timing pattern and the feature written thereto using the recording system of claim 11.

16. A substrate comprising:

a planar recording surface having a center point;

an optically detectable, circumferentially extending timing pattern which extends at a constant radius from the center point along an outer periphery of the planar recording surface; and a plurality of features written to the planar recording surface within the timing pattern during rotation of the substrate about a central axis offset from the center point, at least one of the features from the plurality of features comprising a composite feature written by combining sub-features written to the planar recording surface over multiple passes in which the substrate is separately mounted for rotation about the central axis.

17. The substrate of claim 16, wherein the timing pattern comprises a continuously extending, circular optically detectable pattern that extends about the center point and a once-per-rev optically detectable index mark.

18. The substrate of claim 17, wherein the timing pattern further comprises a multi-bit identification (ID) value associated with the substrate.

19. A recording system for recording data to a rotatable substrate, the recording system comprising:

a support mechanism configured to rotate the substrate about a central axis;

a write element configured to write features to the substrate during said rotation;

a detector adjacent an outermost perimeter of the substrate configured to detect a circumferentially extending timing pattern on the substrate which extends at a fixed radius from a center point of the substrate, the timing pattern comprising a multi-bit identification (ID) value associated with the substrate, the detector further configured to detect the ID value; and a control circuit configured to determine an offset value indicative of a displacement distance between the central axis of the support mechanism and the center point of the substrate responsive to two opposing cross-over transitions of the timing pattern detected by the detector over a full revolution, the control circuit further configured to adjust a position of the write element to write a feature to the rotating substrate responsive to the offset value, the control circuit further configured to compare the detected ID value with an entry in a data structure in a memory to verify a correct substrate is mounted to the support mechanism prior to the writing of the feature thereto.

20. The recording system of claim 19, wherein the write element is further configured to write the circumferentially extending timing pattern to the substrate during a previous rotation thereof during which the central axis is aligned with the center point.

* * * * *